United States Patent [19]
Shiotari

[11] Patent Number: 4,461,964
[45] Date of Patent: Jul. 24, 1984

[54] VOLTAGE COMPARATOR USING CMOS TRANSISTORS

[75] Inventor: Yoshihisa Shiotari, Yokohama, Japan

[73] Assignee: Tokyo Shibaura Denki Kabushiki Kaisha, Kawasaki, Japan

[21] Appl. No.: 354,031

[22] Filed: Mar. 2, 1982

[30] Foreign Application Priority Data

Mar. 9, 1981 [JP] Japan .................. 56-33418

[51] Int. Cl.³ .................. H03K 5/153; H03K 5/24
[52] U.S. Cl. .................. 307/362; 307/279; 307/291; 307/354
[58] Field of Search .......... 307/279, 288, 289, 291, 307/362, 354, 530

[56] References Cited
U.S. PATENT DOCUMENTS 3,309,534  3/1967  Yu et al. .................. 307/279
4,045,686  8/1977  Masuda .................. 307/279
4,070,590  1/1978  Ieda et al. .................. 307/279
4,170,741  10/1979  Williams .................. 307/362

Primary Examiner—John Zazworsky
Attorney, Agent, or Firm—Finnegan, Henderson, Farabow, Garrett & Dunner

[57] ABSTRACT

A voltage comparator comprises a first pair of series-connected CMOS transistors and a second pair of series-connected CMOS transistors which are respectively connected in parallel between power supply terminals and clocked by a common clock pulse. A first MOS transistor having its gate supplied with a reference voltage is connected between the first paired CMOS transistors. A second MOS transistor having its gate supplied with an input voltage to be compared with the reference voltage is connected between the second paired CMOS transistors. An RS flip-flop circuit is provided which has a pair of inputs connected to the drains of the first and second MOS transistors, respectively.

6 Claims, 4 Drawing Figures

VOLTAGE COMPARATOR USING CMOS TRANSISTORS

BACKGROUND OF THE INVENTION

This invention relates to a voltage comparator, and more particularly to a voltage comparator using CMOS transistors.

A conventional CMOS voltage comparator comprises, as shown, for example, FIG. 1, a differential amplifier 11 including N channel differential transistors Q1 and Q2, N channel constant current transistor Q3, P channel load transistors Q4 and Q5 and a CMOS inverter 12 formed of CMOS transistors Q6 and Q7. A reference voltage $V_R$ is applied to the gate of transistor Q1 and an input voltage $V_I$ to be compared with the reference voltage $V_R$ is applied to the gate of transistor Q2.

In operation of the voltage comparator, when the input voltage $V_I$ is higher than the reference voltage $V_R$, the drain voltage of transistor Q2, that is, an output voltage of differential amplifier 11 is at a logic level "0" (ground), causing an output voltage $V_{OUT}$ of the CMOS inverter 12 to go to a logic level "1" ($V_{DD}$). Conversely when the input voltage $V_I$ is lower than the reference voltage $V_R$, the drain voltage of transistor Q1 is at logic level "0", rendering transistor Q5 conducting. Therefore, the output voltage of the differential amplifier 11 is at logic level "1", and the output voltage $V_{OUT}$ of inverter 12 is at logic level "0".

With differential amplifier 11 acting as an analog circuit, current flows from a power supply terminal $V_{DD}$ to a ground power supply terminal, resulting in an increase in power dissipation.

The above-mentioned voltage comparator is integrated on a semiconductor substrate. When threshold voltages of transistors used vary from chip to chip, it is difficult to assure a desired property of the differential amplifier. To suppress variations in the threshold voltages of transistors which occur from chip to chip, it is necessary to precisely design elements used and rigidly control the manufacturing processes of an integrated circuit. When the above-mentioned voltage comparator is large-scale integrated with other circuits, it is necessary to enlarge the dimension of transistors, that is, an area occupied by the differential amplifier 11 in order to restrict variations in the threshold voltages of transistors used within an allowable range.

SUMMARY OF THE INVENTION

It is accordingly an object of this invention to provide a CMOS voltage comparator so arranged as to reduce power dissipation.

Another object of the invention is to provide a CMOS voltage comparator suitable for large-scale integration.

A CMOS voltage comparator of this invention comprises a voltage comparator circuit dynamically driven by a clock pulse; and an RS flip-flop circuit connected to a pair of outputs of the voltage comparator circuit.

The voltage comparator circuit has first and second P channel MOS transistors having their sources coupled to a first power supply terminal, third and fourth N channel MOS transistors having their sources coupled to a second power supply terminal, a fifth MOS transistor having its source-drain path connected between the first and third transistors, and a sixth MOS transistor having its source-drain path connected between the second and fourth transistors. The first to fourth transistors have their gates connected to receive a common pulse. And the fifth and sixth transistors have their gates connected to receive a reference voltage, and an input voltage to be compared with the reference voltage, respectively.

At each of a pair of inputs of the RS flip-flop circuit there is provided a capacitor which may be substituted by a stray capacitance in an integrated circuit.

Where the fifth and sixth transistors are of N channel type like the third and fourth transistors, the capacitors connected to the inputs of the RS flip-flop circuit are charged through the first and second transistors during a first half cycle period of the clock pulse and during a second half cycle period of clock pulse the capacitors discharge through the fifth and third transistors and the sixth and fourth transistors, respectively.

When the input voltage has a different magnitude from the reference voltage, the capacitors are discharged at different speeds. As a result, when the voltage across a capacitor discharged earlier reaches a threshold voltage of the RS flip-flop circuit, the RS flip-flop circuit is set or reset.

If the fifth and sixth transistors are of P channel type like the first and second transistors, then the capacitors are discharged through the third and fourth transistors during the first half cycle period of the clock pulse, and charged through the first and fifth transistors and the second and sixth transistors during the second half cycle period of the clock pulse. Where the input voltage is different from the reference level, the capacitors are charged at different speeds. As a result, when the voltage across a capacitor charged earlier reaches the threshold voltage of the RS flip-flop circuit, the RS flip-flop circuit is set or reset.

DETAILED DESCRIPTION OF THE PREFERRED EMBODIMENTS

Figure 1:
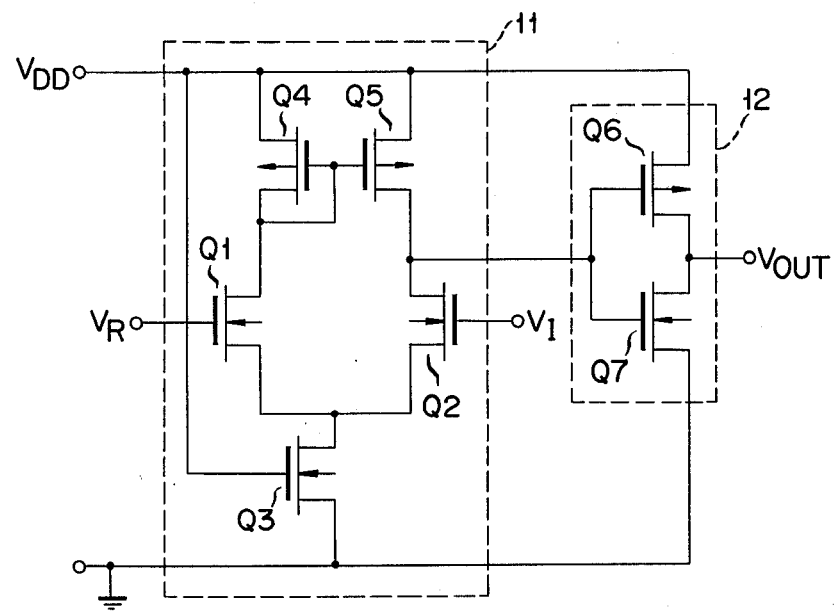
FIG. 1 is a circuit diagram of a conventional CMOS voltage comparator.
Figure 2:
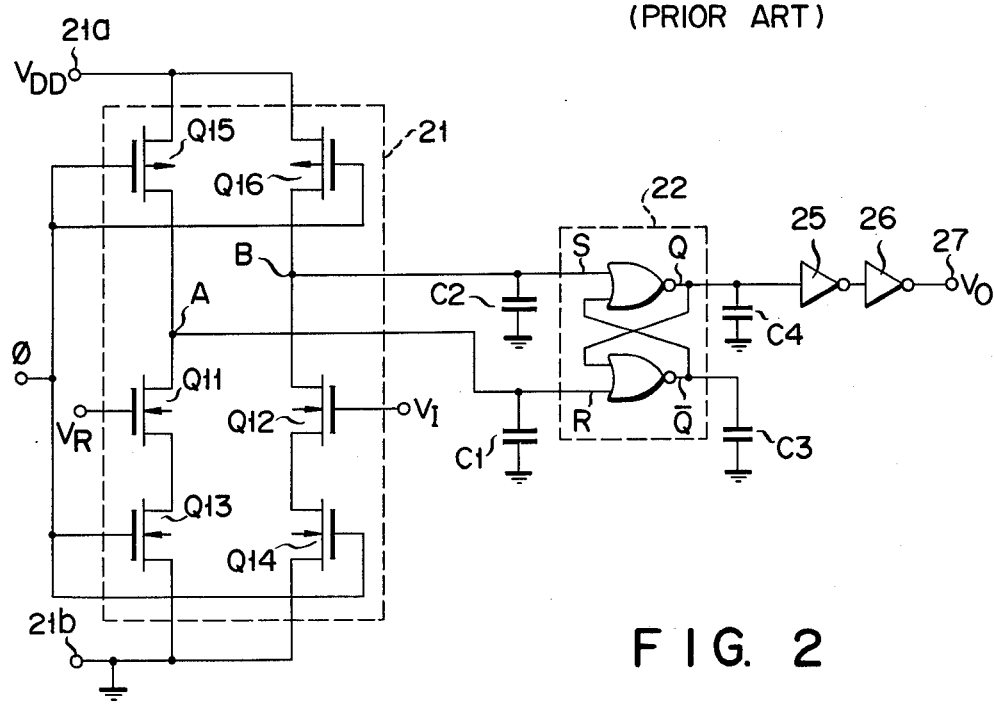
FIG. 2 is a circuit diagram of a CMOS voltage comparator according to an embodiment of this invention.

Description is now given with reference to FIG. 2 of a voltage comparator according to an embodiment of this invention.

Reference numeral 21 denotes a dynamic (clocked) CMOS voltage comparator circuit comprised of transistors Q11 to Q16. Outputs A and B of voltage comparator circuit 21 are respectively connected to set input S and reset input R of an RS flip-flop circuit 22. RS flip-flop circuit 22 is comprised of two-input CMOS NOR gates which are cross-coupled as shown. An output Q of RS flip-flop circuit 22 is connected to an output terminal 27 through CMOS inverters 25 and 26. C1 to C4 denote capacitors which may be substituted by stray capacitances in an integrated circuit.

In voltage comparator circuit 21, transistors Q11 to Q14 are of N channel type, while transistors Q15 and Q16 are of P channel type. Transistors Q15 and Q16 have their sources connected to a first power supply terminal ($V_{DD}$) 21a and their gates connected to receive a clock pulse $\phi$ in common. Transistors Q11 and Q12 have their drains respectively connected to the drains of transistors Q15, Q16 to provide outputs A and B of voltage comparator circuit 21. Transistors Q11 and Q12 have their gates connected to receive a reference voltage $V_R$ and an input voltage $V_I$ to be compared with the reference voltage $V_R$, respectively. Transistors Q13 and Q14 have their drains respectively connected to the sources of transistors Q11 and Q12, their sources connected to a second power supply terminal 21b (ground in this embodiment), and their gates connected to receive the clock pulse $\phi$.

Figure 3:
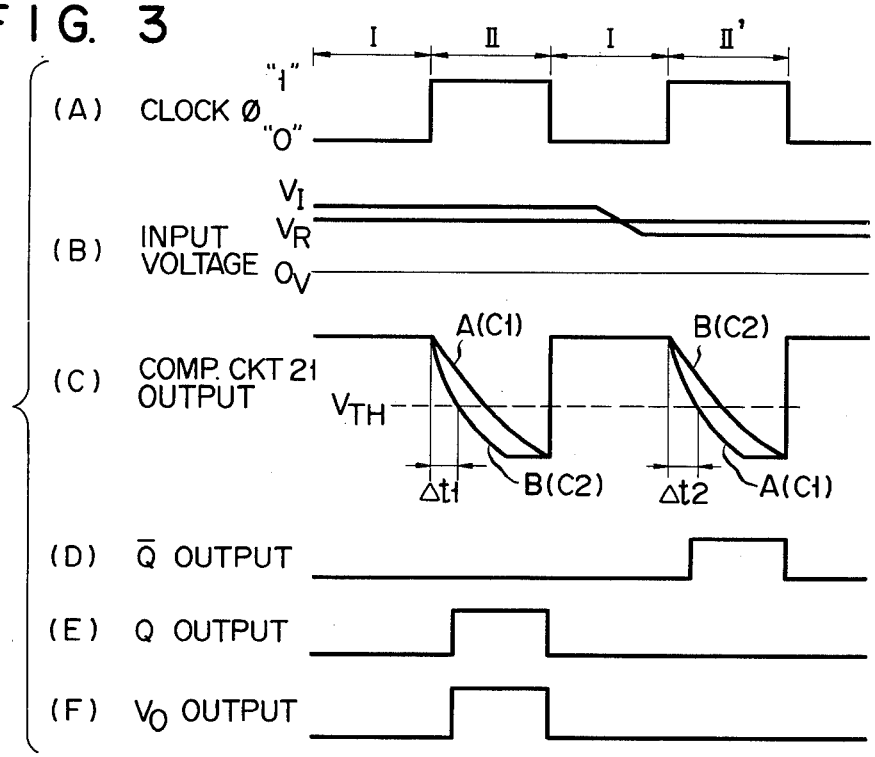
FIG. 3 shows signal waveforms useful in understanding of the operation of the voltage comparator of FIG. 2.

Description is now given by reference to waveform diagrams of FIG. 3 of the operation of the voltage-comparator circuit shown in FIG. 2. Now let it be assumed that the gates of transistors Q13 to Q16 are supplied with the clock pulse $\phi$ shown in FIG. 3A; and intially the input voltage $V_I$ is higher than the reference voltage $V_R$ and later falls below the reference voltage $V_R$ as illustrated in FIG. 3B.

During the period I in which the clock pulse $\phi$ is low (logic "0"), transistors Q13 and Q14 are rendered nonconducting, and transistors Q15 and Q16 are rendered conducting. Therefore, capacitors C1 and C2 respectively connected to output nodes A and B are prechared to a voltage level of $V_{DD}$. As shown in FIGS. 3D and 3C, therefore, the outputs Q and $\overline{Q}$ of RS flip-flop circuit 22 are at low level. Thus output $V_O$ is at low level as indicated in FIG. 3F.

During the period II in which the clock pulse $\phi$ is high (logic "1"), transistors Q13 and Q14 are rendered conducting, while transistors Q15 and Q16 are rendered nonconducting. Consequently capacitors C1 and C2 are discharged through the corresponding transistors Q11 and Q12.

In this case it is necessary to initially cause the dimensions of the paired transistors Q11 and Q12 and paired transistors Q13 and Q14 (further preferably the direction in which current flows on a semiconductor substrate through transistors Q11 and Q13 and the direction in which current runs on the semiconductor substrate through transistors Q12 and Q14) and the capacitiances of capacitors C1 and C2 to exactly correspond to each other. In this case, if $V_I = V_R$, then capacitors C1 and C2 will be discharged with the same waveform.

In case of $V_I > V_R$, capacitor C2 connected to node B is discharged at a higher speed than that at which capacitor C1 connected to node A is discharged. Therefore, a voltage at node B reaches the threshold voltage $V_{TH}$ of flip-flop circuit 22 earlier than a voltage at node A to set flip-flop circuit 22, causing the output Q thereof to go high. Therefore, the output $\overline{Q}$ of flip-flop circuit 22 remains low, regardless of the voltage level at reset input R (node A). As shown in FIG. 3F, therefore, an output $V_O$ of logic level "1" is obtained at output terminal 27.

During a period II' in which $V_I < V_R$ and the clock pulse $\phi$ is high, a larger discharge current runs through transistor Q11 than through transistor Q12, causing node A to reach the threshold voltage $V_{TH}$ earlier than the node B. As a result, the flip-flop circuit 22 is reset, causing the output $\overline{Q}$ thereof to go high as shown in FIG. 3D. In this case, the output Q remains low, regardless of the voltage level at set input S (node B). During the period II', therefore, the output $V_O$ at output terminal 27 is low.

With the voltage comparator of FIG. 2, current does not flow from power supply terminal 21a to power supply terminal 21b in voltage comparator circuit 21. It is only for a short length of time (as $\Delta t1$, $\Delta t2$ shown in FIG. 3) that DC current flows through flip-flop circuit 22, which extends from a point of time at which discharge is started to a point of time at which either node A or node B reaches the threshold voltage $V_{TH}$ of flip-flop circuit 22. Therefore, the voltage comparator of FIG. 2 assures reduction in power dissipation. Moreover, it is easy to fabricate on an integrated circuit each of transistor pairs Q11, Q12; and Q13, Q14 identically.

In order to flow current through transistors Q11 and Q12 of the voltage comparator of FIG. 2, it is necessary that both reference voltage $V_R$ and input voltage $V_I$ should fall within a range between the power supply voltage $V_{DD}$ and the threshold voltage $V_{THN}$ of N channel transistors. For instance, in case of $V_{THN} = 1.0$ V, transistors Q11 and Q12 are not rendered conducting at a lower voltage than 1.0 V, making it impossible to carry out voltage comparison.

Figure 4:
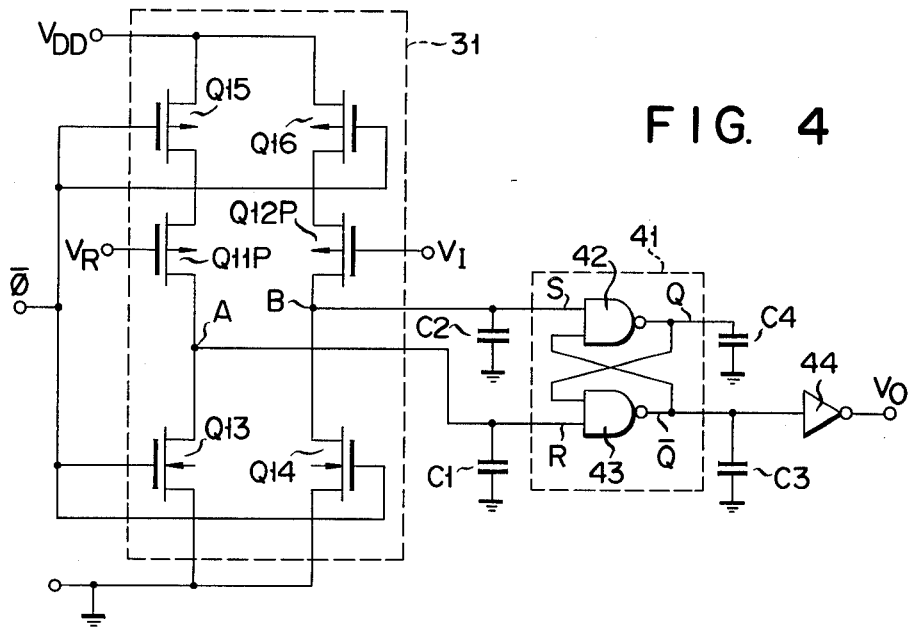
FIG. 4 is a circuit diagram of a CMOS voltage comparator according to another embodiment of the invention.

Description is now given with reference to FIG. 4 of a voltage comparator according to another embodiment of this invention. This voltage comparator is so arranged as to carry out voltage comparison at a level near zero volt. In the second embodiment of FIG. 4, N channel transistor Q11 having gate supplied with the reference voltage $V_R$ and the N channel transistor Q12 having gate supplied with the input voltage $V_I$ are respectively replaced by P channel transistors Q11p and Q12p. A clock pulse $\overline{\phi}$ complementary to the clock pulse $\phi$ of FIG. 3 is applied to the gates of transistors Q13 to Q16. The drains of transistors Q11p and Q12p, namely, the output nodes A and B of voltage-comparing circuit 31 are connected to reset input R and set input S of RS flip-flop circuit 41. The output $\overline{Q}$ of flip-flop circuit 41 is connected to an input of an inverter 44 which provides an output $V_O$ denoting a result of voltage comparison.

While, with the voltage comparator of FIG. 4, the clock pulse $\phi$ is high, transistors Q13 and Q14 are rendered conducting, and transistors Q15 and Q16 are rendered nonconducting. Accordingly, capacitors C1 and C2 are discharged, and both the outputs Q and $\overline{Q}$ of flip-flop circuit 41 go to logic level "1", causing the output $V_O$ to go low. While clock pulse $\phi$ is low, transistors Q13 and Q14 are rendered nonconducting and transistors Q15 and Q16 are rendered conducting. As a result, capacitors C1 and C2 connected to nodes A and B are charged by currents flowing through transistors Q11p and Q12p respectively. In case of $V_I > V_R$, larger current flows through transistor Q11p than through transistor Q12p, causing capacitor C1 to be charged at a higher speed than capacitor C2. Therefore, the reset input R of flip-flop circuit 41 reaches a threshold voltage earlier than set input S of flip-flop circuit 41. As a result, the output $\overline{Q}$ goes to logic level "0", and the output Q goes to logic level "1" causing the output $V_O$ to go to logic level "1". In case of $V_I < V_R$, capacitor C2 is charged at a higher speed than capacitor C1, causing the set input S of flip-flop circuit 41 to reach the threshold voltage earlier than the reset input R thereof. Consequently, the output Q goes to logic level "0", and the output $\overline{Q}$ goes to logic level "1", causing the output $V_O$ to go to logic level "0". Assuming that the threshold voltage of P channel transistors used in the voltage comparator of FIG. 4 is represented by $V_{THP}$, the range of voltage allowing for comparison is from 0 V to $(V_{DD}-|V_{THP}|)V$.

What is claimed is:

1. A voltage comparator comprising:

first and second power supply terminals across which a power supply voltage is applied;

first and second P channel MOS transistors each having source, drain and gate, said sources of said first and second transistors being connected to said first power supply terminal;

third and fourth N channel MOS transistors each having source, drain and gate, said sources of said third and fourth transistors being connected to said second power supply terminal;

fifth and sixth MOS transistors each having source, drain and gate, the source-drain path of said fifth transistor being connected between said drains of said first and third transistors, the source drain path of said sixth transistor being connected between said drains of said second and fourth transistors, and said fifth and sixth transistors having their gates connected to receive a reference voltage, and an input voltage to be compared with the reference voltage, respectively;

means for supplying a clock pulse to said gates of said first to fourth transistors; and an RS flip-flop circuit having first and second inputs respectively connected to said drains of said fifth and sixth transistors.

2. The voltage comparator according to claim 1, wherein said fifth and sixth transistors are of N channel type.

3. The voltage comparator according to claim 1, wherein said fifth and sixth transistors are of P channel type.

4. The voltage comparator according to claim 1, wherein said fifth and sixth transistors are of N channel type; and said RS flip-flop circuit includes cross-coupled NOR gates.

5. The voltage comparator according to claim 1, wherein said fifth and sixth transistors are of P channel type; and said RS flip-flop circuit includes cross-coupled NAND gates.

6. The voltage comparator according to claim 1, further comprising a first capacitor connected between said first input of said RS flip-flop circuit and said second power supply terminal, and a second capacitor connected between said second input of said RS flip-flop circuit and said second power supply terminal.

* * * * *